United States Patent
Kocon

(10) Patent No.: US 9,385,216 B2
(45) Date of Patent: Jul. 5, 2016

(54) MONOLITHICALLY INTEGRATED ACTIVE SNUBBER

(71) Applicant: Texas Instruments Incorporated, Dallas, TX (US)

(72) Inventor: Christopher Boguslaw Kocon, Mountain Top, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/315,701

(22) Filed: Jun. 26, 2014

(65) Prior Publication Data

US 2014/0308787 A1    Oct. 16, 2014

Related U.S. Application Data

(62) Division of application No. 13/540,813, filed on Jul. 3, 2012, now Pat. No. 8,796,745.

(60) Provisional application No. 61/504,624, filed on Jul. 5, 2011.

(51) Int. Cl.
| | |
|---|---|
| H01L 29/66 | (2006.01) |
| H01L 27/06 | (2006.01) |
| H01L 27/07 | (2006.01) |
| H01L 29/94 | (2006.01) |
| H01L 49/02 | (2006.01) |
| H01L 29/417 | (2006.01) |
| H01L 29/78 | (2006.01) |

(52) U.S. Cl.
CPC ...... *H01L 29/66681* (2013.01); *H01L 27/0629* (2013.01); *H01L 27/0733* (2013.01); *H01L 28/24* (2013.01); *H01L 29/41741* (2013.01); *H01L 29/41758* (2013.01); *H01L 29/66659* (2013.01); *H01L 29/66727* (2013.01); *H01L 29/7803* (2013.01); *H01L 29/7835* (2013.01); *H01L 29/94* (2013.01); *H01L 29/41766* (2013.01)

(58) Field of Classification Search
CPC .............. H01L 29/66681; H01L 29/72; H01L 29/1083; H01L 23/642
USPC ............ 257/296, 343, 329, 336, E27.06, 257/E21.417; 438/239; 361/91.7
See application file for complete search history.

(56) References Cited

U.S. PATENT DOCUMENTS

| | | | |
|---|---|---|---|
| 6,720,618 B2 | 4/2004 | Kawaguchi et al. | |
| 7,382,030 B1 | 6/2008 | Ivanov et al. | |
| 7,420,247 B2 * | 9/2008 | Xu ...................... | H01L 29/1083 257/329 |
| 2007/0274014 A1* | 11/2007 | Berberich ............. | H01L 23/642 361/91.7 |
| 2010/0163950 A1 | 7/2010 | Gladish et al. | |
| 2010/0327348 A1 | 12/2010 | Hashimoto et al. | |

FOREIGN PATENT DOCUMENTS

JP      2010206106      9/2010

* cited by examiner

*Primary Examiner* — Kenneth Parker
*Assistant Examiner* — Young W Kim
(74) *Attorney, Agent, or Firm* — Jacqueline J. Garner; Frank D. Cimino

(57) ABSTRACT

A semiconductor device containing an extended drain MOS transistor with an integrated snubber formed by forming a drain drift region of the MOS transistor, forming a snubber capacitor including a capacitor dielectric layer and capacitor plate over the extended drain, and forming a snubber resistor over a gate of the MOS transistor so that the resistor is connected in series between the capacitor plate and a source of the MOS transistor.

7 Claims, 11 Drawing Sheets

MONOLITHICALLY INTEGRATED ACTIVE SNUBBER

CROSS REFERENCE TO RELATED APPLICATIONS

This application is a divisional of U.S. Nonprovisional patent application Ser. No. 13/540,813, filed Jul. 3, 2012, and claims the priority of U.S. provisional application Ser. No. 61/504,624 filed Jul. 5, 2011, the contents of which are herein incorporated by reference in its entirety.

FIELD OF THE INVENTION

This invention relates to the field of semiconductor devices. More particularly, this invention relates to extended drain MOS transistors in semiconductor devices.

BACKGROUND OF THE INVENTION

A semiconductor device may be part of or contain a circuit which produces undesired voltage excursions, such as a buck converter circuit which receives an input DC voltage and generates an output DC voltage that is lower than the input voltage. The semiconductor device may include an extended drain metal oxide semiconductor (MOS) transistor, which, during operation of the circuit, switching of the MOS transistor between the on state and the off state may cause undesirable voltage oscillations, commonly referred to as ringing, at the drain node. It may be desirable to add a snubber to the semiconductor device which damps the ringing. Integrating a snubber in the semiconductor device with desired performance and without significantly increasing fabrication cost and complexity of the semiconductor device may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device containing an extended drain MOS transistor may be formed with an integrated snubber by a process of forming a drain drift region in an extended drain of the MOS transistor, and forming a snubber capacitor including a capacitor dielectric layer and capacitor plate over the extended drain. A snubber resistor is formed over a gate of the MOS transistor and connected in series between the capacitor plate and a source of the MOS transistor. The snubber resistor and snubber capacitor form the integrated snubber for the MOS transistor. The resistor may be formed concurrently with other elements of the semiconductor device.

DETAILED DESCRIPTION OF EXAMPLE EMBODIMENTS

Figure 1A:
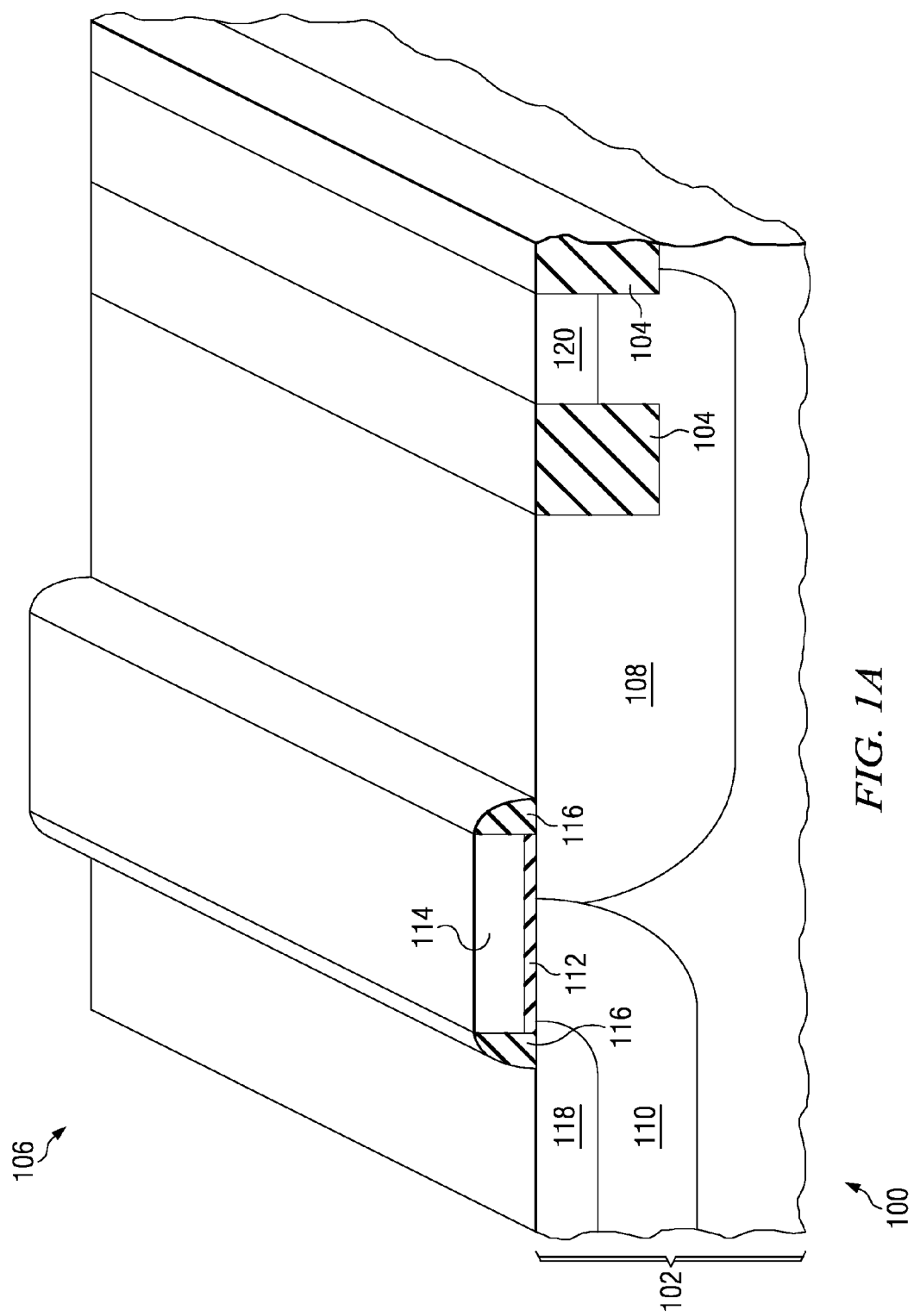
FIG. 1A through FIG. 1C are perspective cross sections of a semiconductor device containing an extended drain MOS transistor with a snubber, formed according to an embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device containing an extended drain MOS transistor may be formed with an integrated snubber integrated into the MOS transistor. The semiconductor device may be formed by a process including steps of forming a drain drift region in an extended drain of the MOS transistor A snubber capacitor is formed over the drain drift region by forming a capacitor dielectric layer and capacitor plate over the extended drain. A snubber resistor is formed over a gate of the MOS transistor and connected in series between the capacitor plate and a source of the MOS transistor. The snubber resistor and snubber capacitor form the integrated snubber for the MOS transistor. The resistor may be formed concurrently with other elements of the semiconductor device. The resistor may be formed concurrently with the capacitor plate.

The semiconductor device may be a discrete power device which includes the extended drain MOS transistor with the integrated snubber. Alternatively, the semiconductor device may be an integrated circuit which includes other circuits, such as sense circuits and/or control circuits, in addition to the extended drain MOS transistor with the integrated snubber.

This description recites formation of n-channel extended drain MOS transistors. It will be recognized that p-channel extended drain MOS transistors may be formed according the recited embodiments with appropriate changes in polarities of dopants and conductivity types.

Figure 1B:
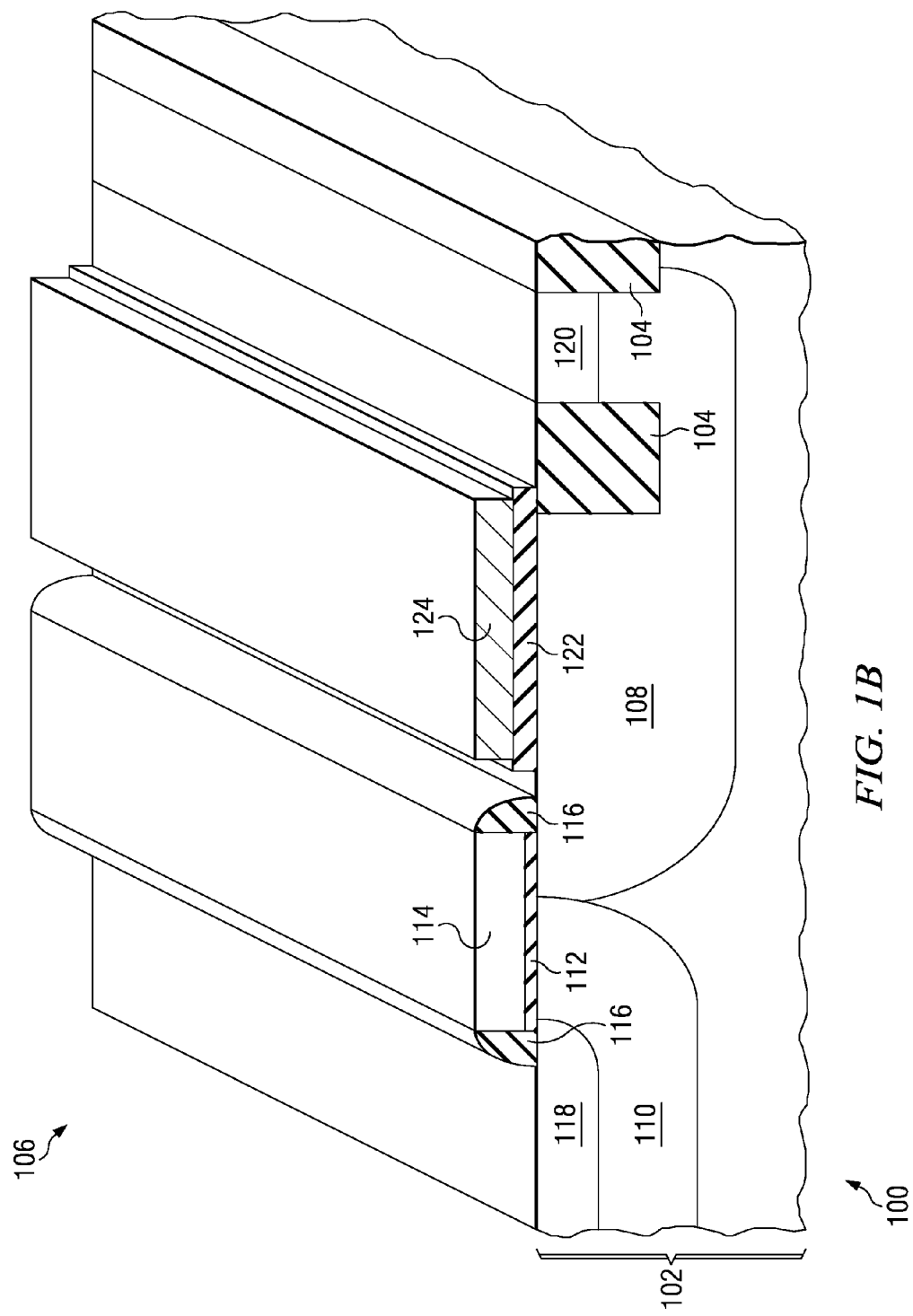
Figure 1C:
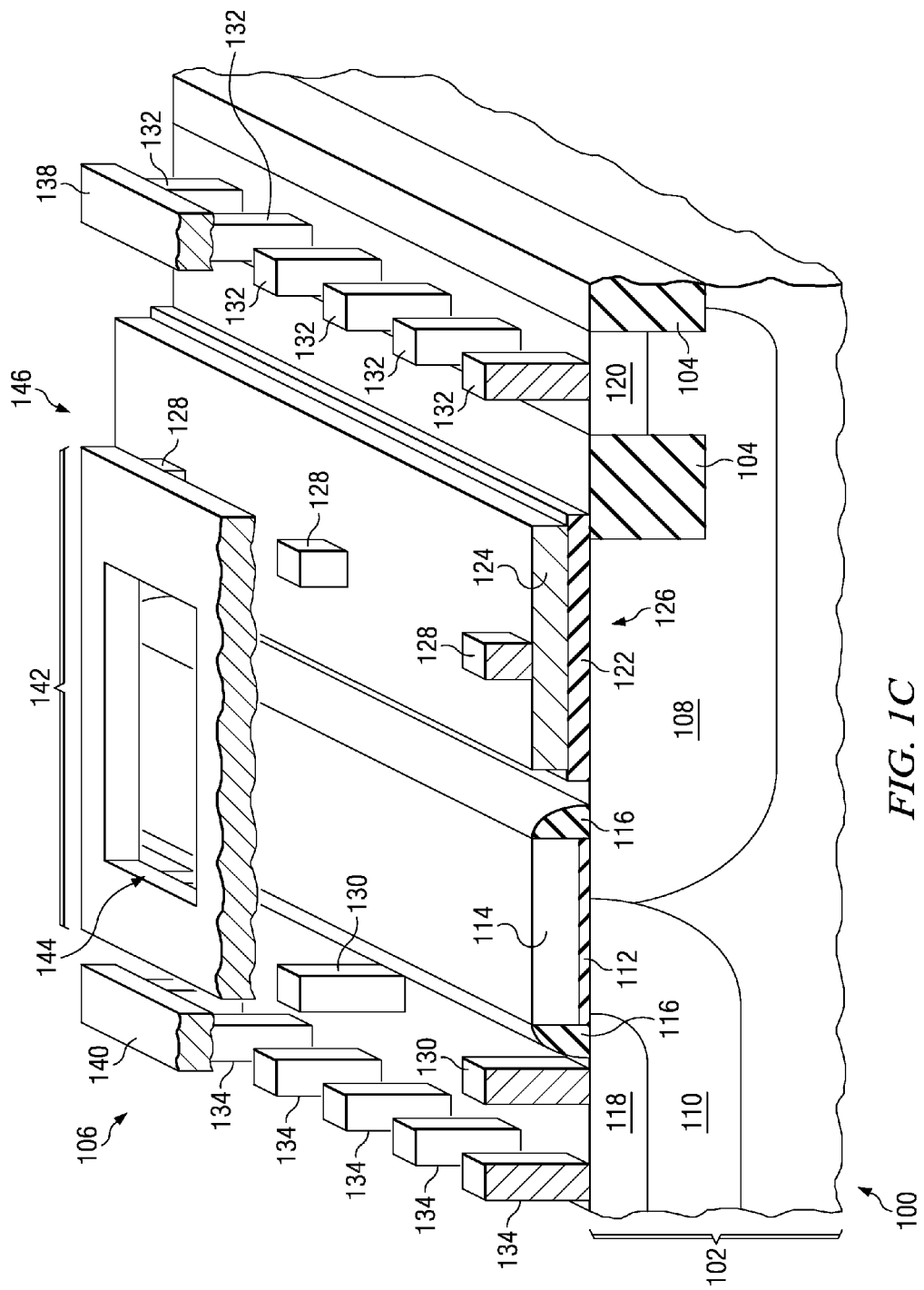

FIG. 1A through FIG. 1C are perspective cross sections of a semiconductor device containing an extended drain MOS transistor with a snubber, formed according to an embodiment, depicted in successive stages of fabrication. Referring to FIG. 1A, the semiconductor device 100 is formed in and on a semiconductor substrate 102 which may be a single crystal silicon wafer, a silicon-on-insulator (SOI) wafer, a hybrid orientation technology (HOT) wafer with regions of different crystal orientations, or other material appropriate for fabrication of the semiconductor device 100. Semiconductor material at a top surface of the substrate 102 is p-type. Field oxide 104 may be formed at the top surface of the substrate 102. The field oxide 104 may include silicon dioxide between 250 and 600 nanometers thick, and may be formed by shallow trench isolation (STI) or local oxidation of silicon (LOCOS) processes. In STI processes, silicon dioxide may be deposited by high density plasma (HDP) or high aspect ratio process (HARP).

The semiconductor device 100 contains the extended drain MOS transistor 106. The MOS transistor 106 has an n-type drain drift region 108 extending to the top surface of the substrate 102. The drain drift region 108 may be formed, for example, by ion implanting a first set of n-type dopants, such as phosphorus and arsenic, and possibly antimony, at doses from $1 \cdot 10^{11}$ to $1 \cdot 10^{13}$ atoms/cm$^2$, into an area exposed by a drift region implant mask, such as a photoresist pattern. A subsequent anneal process activates at least a portion of the first set of n-type dopants to form the drain drift region 108. The drain drift region 108 may extend to a depth between 350 to 1000 nanometers in the substrate 102. The drain drift region 108 may be formed concurrently with other components of the semiconductor device 100 such as n-type wells for p-channel MOS transistors, not shown.

The MOS transistor 106 further includes a p-type body region 110 in the substrate 102 abutting the drain drift region 108. The body region 110 may be formed, for example, by ion implanting a set of p-type dopants, such as boron and possibly gallium and/or indium, at doses from $1 \cdot 10^{11}$ to $1 \cdot 10^{14}$ atoms/cm$^2$, into an area exposed by a body region implant mask, such as a photoresist pattern. A subsequent anneal process activates at least a portion of the p-type dopants to form the body region 110. The body region 110 may extend to a depth between 300 to 1000 nanometers in the substrate 102. The body region 110 may be formed concurrently with other components of the semiconductor device 100 such as p-type wells for n-channel MOS transistors, not shown. The anneal process to activate the p-type dopants may be performed concurrently with the anneal process to activate the first set of n-type dopants in the drain drift region 108.

A gate dielectric layer 112 of the MOS transistor 106 is formed over the substrate 102 overlapping a portion of the body region 110 and a portion of the drain drift region 108. The gate dielectric layer 112 may be one or more layers of silicon dioxide, silicon oxy-nitride, aluminum oxide, aluminum oxy-nitride, hafnium oxide, hafnium silicate, hafnium silicon oxy-nitride, zirconium oxide, zirconium silicate, zirconium silicon oxy-nitride, a combination of the aforementioned materials, or other insulating material. The gate dielectric layer 112 may include nitrogen as a result of exposure to a nitrogen containing plasma or a nitrogen containing ambient gas at temperatures between 50 C and 800 C. The gate dielectric layer 112 may be formed by any of a variety of gate dielectric formation processes, for example thermal oxidation, plasma nitridation of an oxide layer, and/or dielectric material deposition by atomic layer deposition (ALD). The gate dielectric layer 112 may be, for example, between 10 and 80 nanometers thick.

A gate 114 of the MOS transistor 106 is formed on the gate dielectric layer 112, overlapping a portion of the body region 110 and a portion of the drain drift region 108. The gate 114 may include, for example, one or more layers of polycrystalline silicon, commonly referred to as polysilicon, metal silicide such as tungsten silicide, titanium silicide, cobalt silicide and/or nickel silicide, and/or metal such as aluminum, tungsten and/or titanium nitride.

Optional gate sidewalls 116 may be formed on lateral surfaces of the gate 114, for example by deposition of one or more conformal layers of silicon nitride and/or silicon dioxide on a top and lateral surfaces of the gate 114 and the top surface of the substrate 102, followed by removal of the conformal layer material from the top surface of the gate 114 and the top surface of the substrate 102 by anisotropic etching methods such as reactive ion etching (RIE), leaving the conformal layer material on the lateral surfaces of the gate 114 so as to form the gate sidewalls 116.

The MOS transistor 106 also includes an n-type source region 118 and possibly an optional n-type drain contact region 120. The source region 118 is formed in the substrate 102 adjacent to the gate 114 opposite from the drain drift region 108. The drain contact region 120 is formed in the substrate 102 contacting the drain drift region 108 opposite from the gate 114. The source region 118 and the drain contact region 120 may be formed, for example, by ion implanting a second set of n-type dopants, such as phosphorus and arsenic, and possibly antimony, at a total dose between $3 \cdot 10^{14}$ and $1 \cdot 10^{16}$ atoms/cm$^2$ into an area exposed by a source/drain implant mask, such as a photoresist pattern. A subsequent source/drain anneal process activates a portion of the second set of n-type dopants to form the source region 118 and the drain contact region 120. The source region 118 and the drain contact region 120 may extend from the top surface of the substrate 102 to a depth between 100 and 500 nanometers. The source region 118 and the drain contact region 120 may be formed concurrently with other components of the semiconductor device 100 such as source/drain regions for other n-channel MOS transistors, not shown. A layer or metal silicide, not shown, such as titanium silicide, cobalt silicide or nickel silicide, may be formed on the source region 118 and the drain contact region 120.

An element of the field oxide 104 may be disposed in the drain drift region 108 so as to laterally separate the drain contact region 120 from a remaining portion of the drain contact region 120; the drain contact region 120 extends under the field oxide 104.

Referring to FIG. 1B, a snubber capacitor dielectric layer 122 is formed over the drain drift region 108 adjacent to the gate 114. The snubber capacitor dielectric layer 122 may optionally overlap the field oxide element 104 disposed in the drain drift region 108 if present. The snubber capacitor dielectric layer 122 may include, for example, one or more layers of silicon dioxide, silicon oxy-nitride, aluminum oxide, aluminum oxy-nitride, hafnium oxide, hafnium silicate, hafnium silicon oxy-nitride, zirconium oxide, zirconium silicate, zirconium silicon oxy-nitride, a combination of the aforementioned materials, or other insulating material. The snubber capacitor dielectric layer 122 may be, for example, between 10 and 200 nanometers thick. The snubber capacitor dielectric layer 122 may be formed by any of a variety of gate dielectric formation processes, for example thermal oxidation, plasma nitridation of an oxide layer, and/or dielectric material deposition by ALD.

A snubber capacitor plate 124 is formed over the snubber capacitor dielectric layer 122 so as to be electrically isolated from the drain drift region 108. The snubber capacitor plate 124 may be formed of any electrically conductive material, such as one or more layers of polysilicon, tungsten, aluminum, titanium, tantalum, titanium tungsten, metal silicide, titanium nitride, tantalum nitride, and/or tungsten nitride. The snubber capacitor plate 124 may be, for example between 1 and 10 microns wide in a direction perpendicular to a lateral boundary of the gate 114. The snubber capacitor plate 124 may be formed concurrently with other components in the semiconductor device 100 such as decoupling capacitor plates, not shown. The snubber capacitor plate 124, the snubber capacitor dielectric layer 122 and the drain drift region 108 form a snubber capacitor 126.

A pre-metal dielectric (PMD) layer is formed over an existing top surface of the semiconductor device 100. The PMD layer may be, for example, a dielectric layer stack including a PMD liner, a PMD main layer, and an optional PMD cap layer. The PMD liner may be silicon nitride or silicon dioxide, 10 to 100 nanometers thick, deposited by plasma enhanced chemical vapor deposition (PECVD) on the existing top surface of the semiconductor device 100. The PMD main layer may be a layer of silicon dioxide formed by a HARP process followed by a layer of silicon dioxide, phospho-silicate glass (PSG) or boro-phospho-silicate glass (BPSG), 100 to 1000 nanometers thick, deposited by a PECVD process on a top surface of the PMD liner, and sometimes leveled by a chemical-mechanical polish (CMP) process. The optional PMD cap layer may be 10 to 100 nanometers of a hard material such as silicon nitride, silicon carbide nitride or silicon carbide, formed on a top surface of the PMD main layer. The PMD layer is not shown in FIG. 1C to more clearly illustrate the other elements of the MOS transistor 106.

Referring to FIG. 1C, one or more snubber capacitor contacts 128 are formed through the PMD layer so as to make electrical contact with the snubber capacitor plate 124. One or more snubber source contacts 130 are formed in the PMD layer so as to make electrical contact with the source region 118. The snubber capacitor contacts 128 and snubber source contacts 130 may be formed concurrently.

One or more transistor drain contacts 132 are formed through the PMD layer so as to make electrical contact with the drain drift region 108, through the drain contact region 120 if present. One or more transistor source contacts 134 are formed through the PMD layer so as to make electrical contact with the source region 118. The transistor drain contacts 132 and the transistor source contacts 134 may be formed concurrently, and may be formed concurrently with the snubber capacitor contacts 128 and the snubber source contacts 130.

The transistor drain contacts 132, the transistor source contacts 134, the snubber capacitor contacts 128 and the snubber source contacts 130 may be formed, for example, by defining contact areas on a top surface of the PMD with a contact photoresist pattern, not shown, etching contact holes in the contact areas by removing PMD layer material using etching methods such as RIE to expose the snubber capacitor plate 124, the source region 118 and the drain contact region 120, and filling the contact holes with a contact liner, such as titanium and titanium nitride, and a contact fill metal, such as tungsten, followed by removal of the contact fill metal and contact liner from the top surface of the PMD layer using etching and/or CMP methods.

A snubber resistor link 136 is formed over the PMD layer so as to make electrical contact with the snubber capacitor contacts 128 and the snubber source contacts 130. A drain interconnect 138 is formed over the PMD layer so as to make electrical contact with the transistor drain contacts 132 and a source interconnect 140 is formed over the PMD layer so as to make electrical contact with the transistor source contacts 134. In the instant embodiment, the drain interconnect 138, the source interconnect 140 and the snubber resistor link 136 are formed concurrently, and may be formed concurrently with other interconnects, not shown, in the semiconductor device 100.

The drain interconnect 138, the source interconnect 140 and the snubber resistor link 136 may be formed using an aluminum metallization process, which includes forming a layer of barrier metal such as titanium tungsten or titanium nitride between 5 and 15 nanometers thick on the PMD layer, forming a layer of aluminum interconnect metal such as an alloy of 96 percent aluminum, 2 percent silicon and 2 percent copper between 100 and 1500 nanometers thick on the layer of barrier metal, and forming a layer of cap metal such as titanium tungsten or titanium nitride between 5 and 15 nanometers thick on the layer of aluminum interconnect metal. A metallization etch mask such as a photoresist pattern is formed over the layer of cap metal so as to expose the layer of cap metal in areas to remove unwanted metal. A metallization etch process is performed, such as an RIE step including fluorine to remove the cap metal in the exposed area, a subsequent RIE step including chlorine to etch the aluminum interconnect metal with fluorine to passivate lateral surfaces of the etched aluminum interconnect metal, followed by another RIE step including fluorine to etch the barrier metal, so as to leave an interconnect element.

Alternatively, the drain interconnect 138, the source interconnect 140 and the snubber resistor link 136 may be formed using a copper damascene interconnect process, which includes forming an interlevel dielectric (ILD) layer such as silicon dioxide or a low-k dielectric over the PMD layer, and etching trenches in the ILD layer, commonly between 100 and 250 nanometers deep, in areas defined for the copper damascene interconnects. The trenches expose top surfaces of the drain interconnect 138, the source interconnect 140 and the snubber resistor link 136. A layer of liner metal such as tantalum nitride is formed on a bottom and sides of the trenches, commonly by physical vapor deposition, atomic layer deposition or chemical vapor deposition. A seed layer of copper is formed on the liner metal, commonly by sputtering. The trenches are subsequently filled with copper, commonly by electroplating. Copper and liner metal are removed from a top surface of the ILD layer by CMP and etch processes, leaving the copper damascene interconnects in the ILD layer.

In the instant embodiment, the snubber capacitor contacts 128, the snubber resistor link 136 and the snubber source contacts 130 form a snubber resistor 142 which is connected in series between the snubber capacitor plate 124 and the source region 118. One or more resistor apertures 144 may be formed in the snubber resistor link 136 to increase an electrical resistance of the snubber resistor 142. A total quantity of the snubber capacitor contacts 128 and/or a total quantity of the snubber source contacts 130 may be selected to provide a desired value of the electrical resistance of the snubber resistor 142. The electrical resistance of the snubber resistor 142 may be, for example, between 0.5 ohms and 20 ohms. The snubber resistor 142 and the snubber capacitor 126 form an integrated snubber 146.

Figure 2A:
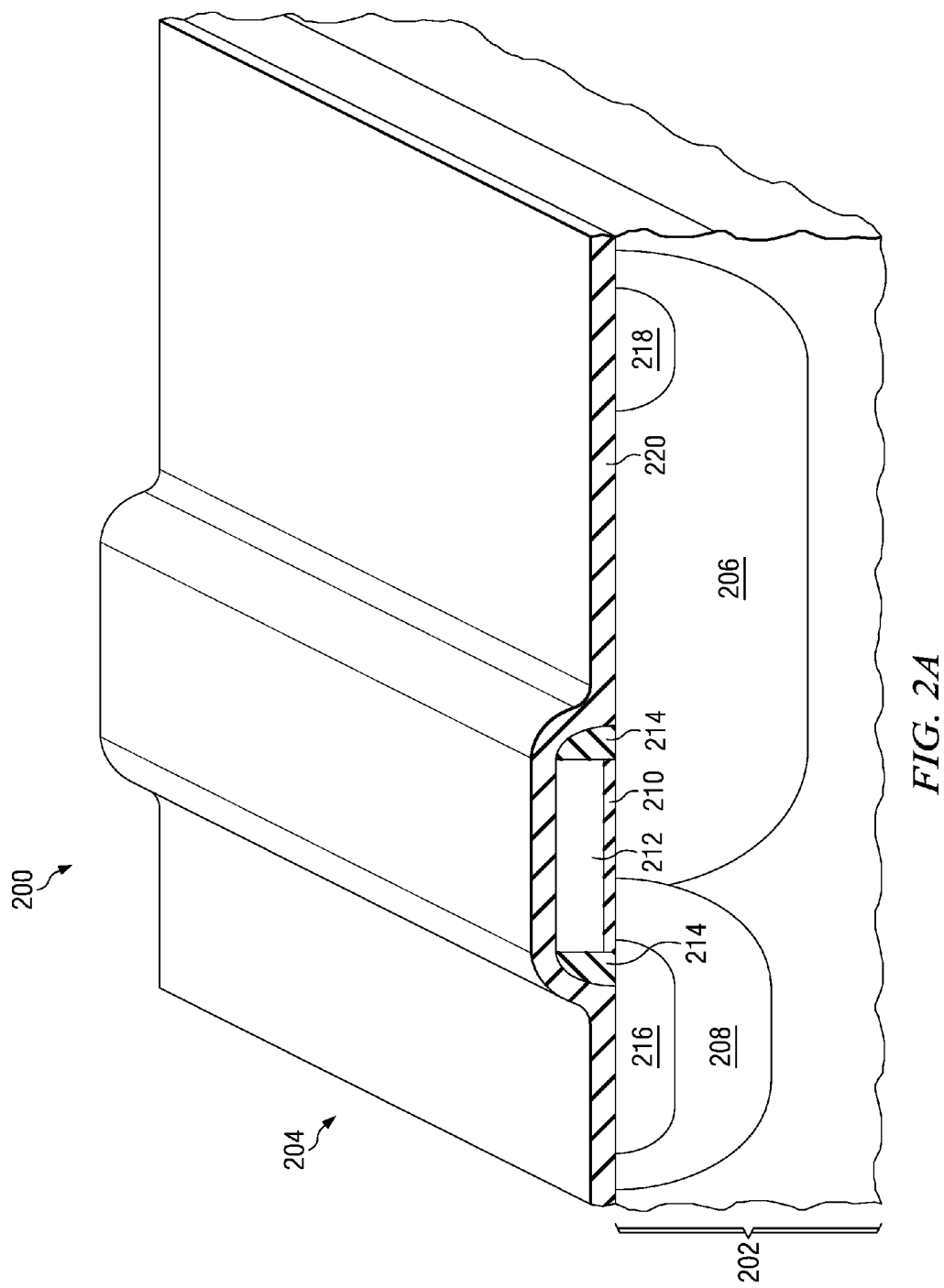
FIG. 2A through FIG. 2C are perspective cross sections of a semiconductor device containing an extended drain MOS transistor with a snubber, formed according to another embodiment, depicted in successive stages of fabrication.
Figure 2B:
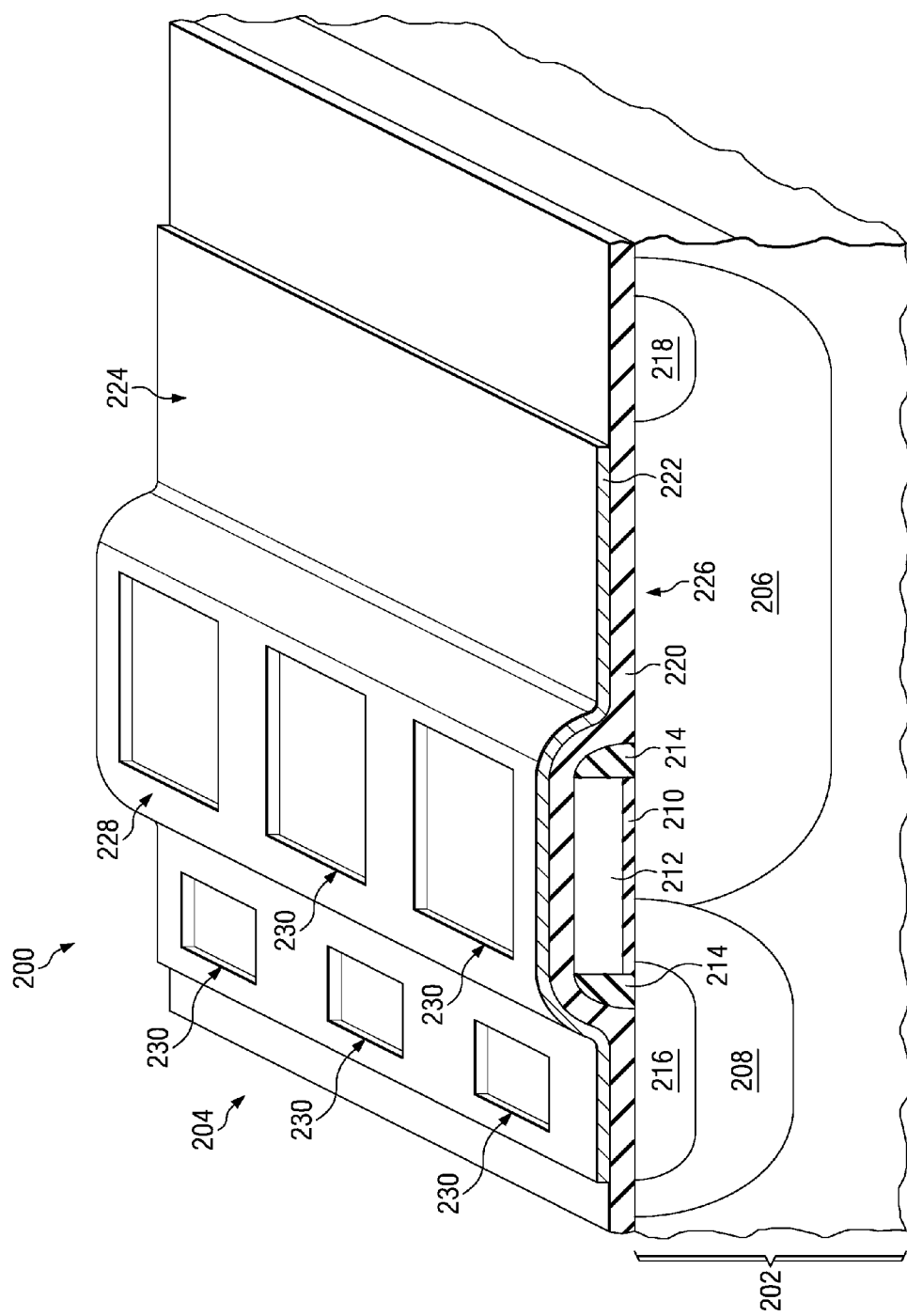
Figure 2C:
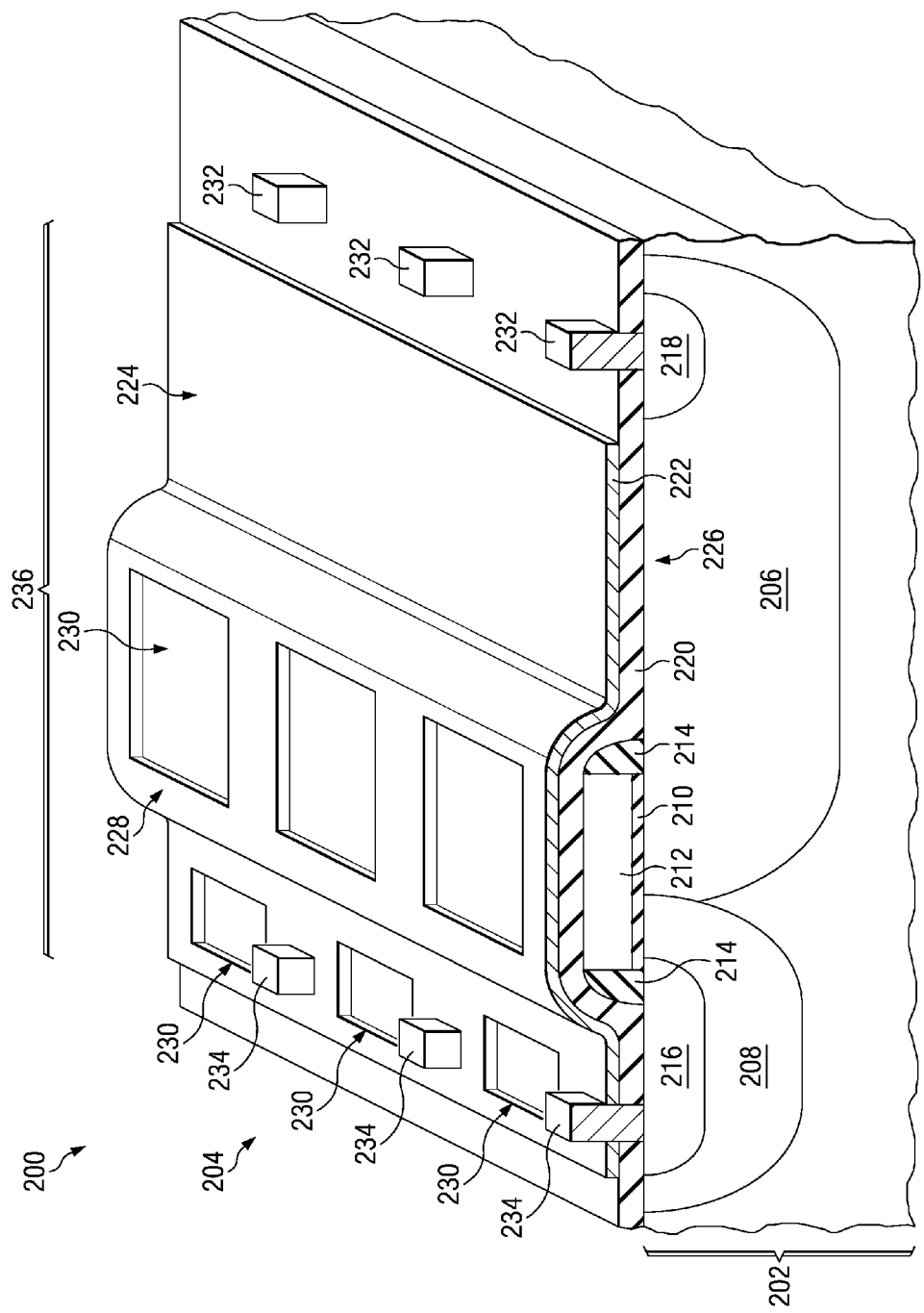

FIG. 2A through FIG. 2C are perspective cross sections of a semiconductor device containing an extended drain MOS transistor with a snubber, formed according to another embodiment, depicted in successive stages of fabrication. Referring to FIG. 2A, the semiconductor device 200 is formed in and on a semiconductor substrate 202 as described in reference to FIG. 1A. Field oxide, not shown, may optionally be formed at the top surface of the substrate 202, as described in reference to FIG. 1A. The MOS transistor 204 has an n-type drain drift region 206, as described in reference to FIG. 1A, extending to the top surface of the substrate 202. The MOS transistor 204 further includes a p-type body region 208 in the substrate 202 abutting the drain drift region 206, as described in reference to FIG. 1A. A gate dielectric layer 210, gate 212 and optional gate sidewalls 214 of the MOS transistor 204 are formed over the substrate 202 overlapping a portion of the body region 208 and a portion of the drain drift region 206, as described in reference to FIG. 1A. The MOS transistor 204 also includes an n-type source region 216 and possibly an optional n-type drain contact region 218, as described in reference to FIG. 1A.

A snubber capacitor dielectric layer 220 is formed over an existing top surface of the semiconductor device 200. The snubber capacitor dielectric layer 220 may be formed of materials described in reference to FIG. 1B. In the instant embodiment, the snubber capacitor dielectric layer 220 extends above the drain drift region 206 and over the gate 212 and source region 216.

Referring to FIG. 2B, a snubber resistor/capacitor layer 222 is formed on the snubber capacitor dielectric layer 220, extending above the drain drift region 206 and over the gate 212 and source region 216. The snubber resistor/capacitor layer 222 is patterned so as to be electrically isolated from other components, not shown, in the semiconductor device 200. The snubber resistor/capacitor layer 222 may include one or more layers of electrically conductive material such as polysilicon, metal silicide such as tungsten silicide, titanium silicide, cobalt silicide or nickel silicide, metal such as aluminum, tungsten, titanium, tantalum, or metal alloy such as titanium tungsten, titanium nitride, tantalum nitride, nickel chromium, silicon chromium or thin film resistor material such as cermet, a ceramic-metal material.

A portion of the snubber resistor/capacitor layer 222 over the drain drift region 206 forms a snubber capacitor plate 224. The snubber capacitor plate 224, the snubber capacitor dielectric layer 220 and the drain drift region 206 form a snubber capacitor 226.

A portion of the snubber resistor/capacitor layer 222 over the gate 212 and source region 216 forms a snubber resistor 228. A thickness of the snubber resistor/capacitor layer 222 may be selected so as to provide a desired value of electrical resistance of the snubber resistor 228. One or more resistor apertures 230 may be formed in the snubber resistor/capacitor layer 222 so as to increase the electrical resistance of the snubber resistor 228. The electrical resistance of the snubber resistor 228 may be, for example, between 0.5 and 20 ohms.

A PMD layer, not shown, is formed over an existing top surface of the semiconductor device 200, as described in reference to FIG. 1C. The PMD layer is not shown in FIG. 2C to more clearly illustrate the other elements of the MOS transistor 204.

Referring to FIG. 2C, one or more transistor drain contacts 232 are formed through the PMD layer so as to make electrical contact with the drain drift region 206, through the drain contact region 218 if present. One or more transistor source contacts 234 are formed through the PMD layer so as to make electrical contact with the source region 216 and the snubber resistor 228. The transistor drain contacts 232 and the transistor source contacts 234 may be formed as described in reference to FIG. 1C.

The snubber resistor 228 and the snubber capacitor 226 form an integrated snubber 236.

Figure 3A:
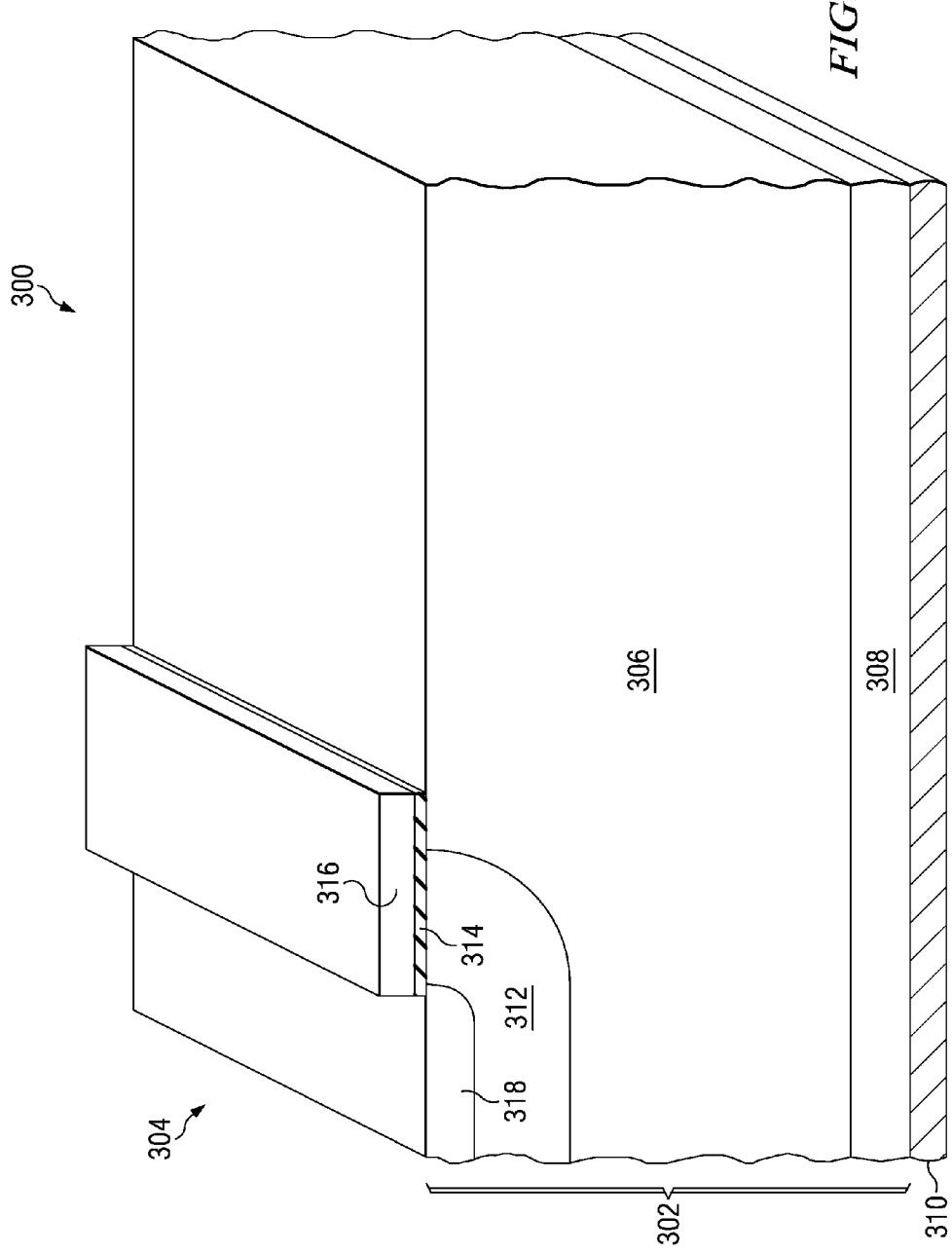
FIG. 3A through FIG. 3C are perspective cross sections of a semiconductor device containing an extended drain MOS transistor with a snubber, formed according to a further embodiment, depicted in successive stages of fabrication.
Figure 3B:
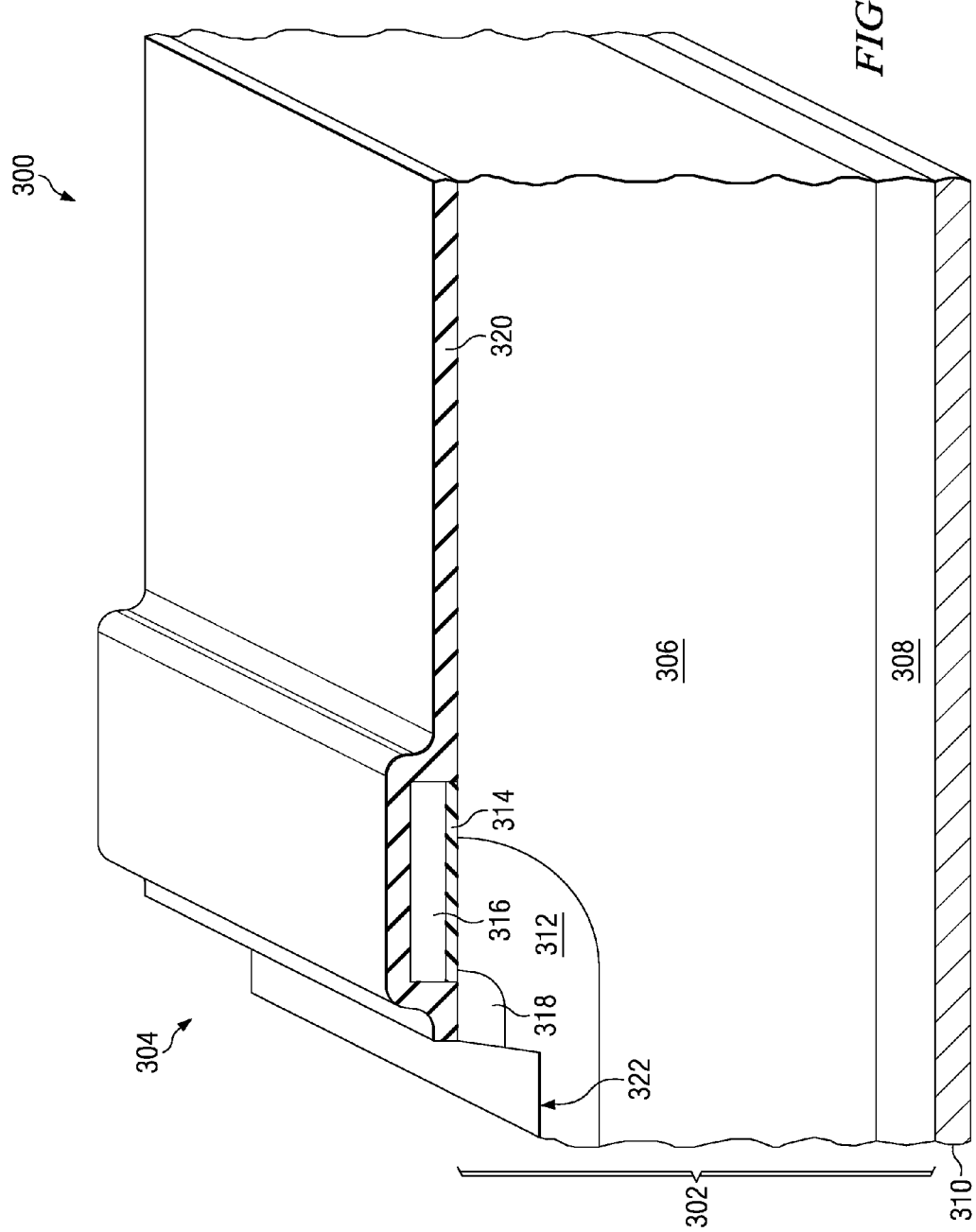
Figure 3C:
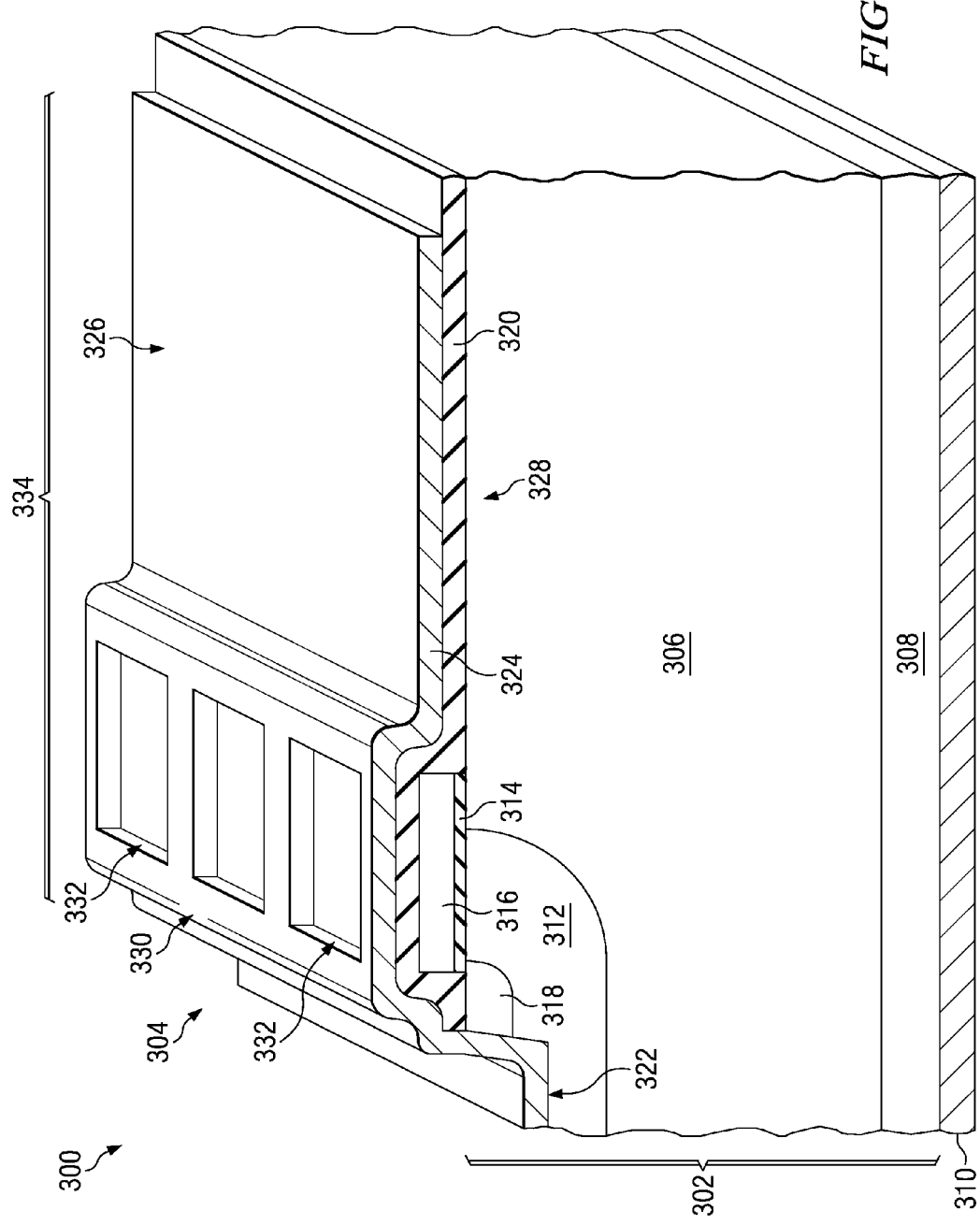

FIG. 3A through FIG. 3C are perspective cross sections of a semiconductor device containing an extended drain MOS transistor with a snubber, formed according to a further embodiment, depicted in successive stages of fabrication. Referring to FIG. 3A, the semiconductor device 300 is formed in an on a thin semiconductor substrate 302. The substrate 302 may be single crystal silicon or a semiconductor allow such as silicon germanium. In the instant embodiment, the substrate 302 is between 5 and 100 microns thick. The MOS transistor 304 includes an n-type drain drift region 306 which extends from a top surface of the substrate 302 to, or proximate to, a bottom surface of the substrate 302. The MOS transistor 304 may optionally include an n-type drain contact region 308 at the bottom surface of the substrate 302 and contacting the drain drift region 306. The drain contact region 308 may be formed by ion implanting the bottom surface of the substrate 302 with n-type dopants and subsequently performing an anneal process to activate at least a portion of the implanted dopants. The MOS transistor 304 further includes a drain contact metal layer 310 on, and making electrical connection with, the bottom surface of the substrate 302.

The MOS transistor 304 includes a p-type body region 312 in the substrate 302 abutting the drain drift region 306, at the top surface of the substrate 302. A gate dielectric layer 314 and gate 316 of the MOS transistor 304 are formed over the substrate 302 overlapping a portion of the body region 312 and a portion of the drain drift region 306 at the top surface of the substrate 302. The MOS transistor 304 also includes an n-type source region 318 formed in the substrate 302 adjacent to the gate 316 opposite from the drain drift region 306, and isolated from the drain drift region 306 by the body region 312.

Referring to FIG. 3B, a snubber capacitor dielectric layer 320 is formed over an existing top surface of the semiconductor device 300. The snubber capacitor dielectric layer 320 may be formed of materials described in reference to FIG. 1B. In the instant embodiment, the snubber capacitor dielectric layer 320 extends above the drain drift region 306 and over the gate 316 and source region 318.

A source trench 322 is formed in the substrate 302 through the source region 318 and into the body region 312, adjacent to, but laterally separated from, the gate 316.

Referring to FIG. 3C, a snubber resistor/capacitor layer 324 is formed on the snubber capacitor dielectric layer 320, extending above the drain drift region 306 and over the gate 316 and source region 318, and into the source trench 322 so as to make electrical contact with the source region 318 and the body region 312. The snubber resistor/capacitor layer 324 is patterned so as to be electrically isolated from other components, not shown, in the semiconductor device 300. The snubber resistor/capacitor layer 324 may be formed of the materials described in reference to FIG. 2C.

A portion of the snubber resistor/capacitor layer 324 over the drain drift region 306 forms a snubber capacitor plate 326. The snubber capacitor plate 326, the snubber capacitor dielectric layer 320 and the drain drift region 306 form a snubber capacitor 328.

A portion of the snubber resistor/capacitor layer 324 over the gate 316 forms a snubber resistor 330. A thickness of the snubber resistor/capacitor layer 324 may be selected so as to provide a desired value of electrical resistance of the snubber resistor 330. One or more resistor apertures 332 may be formed in the snubber resistor/capacitor layer 324 so as to increase the electrical resistance of the snubber resistor 330. The electrical resistance of the snubber resistor 330 may be, for example, between 0.5 and 20 ohms. The snubber resistor 330 and the snubber capacitor 328 form an integrated snubber 334.

Figure 4A:
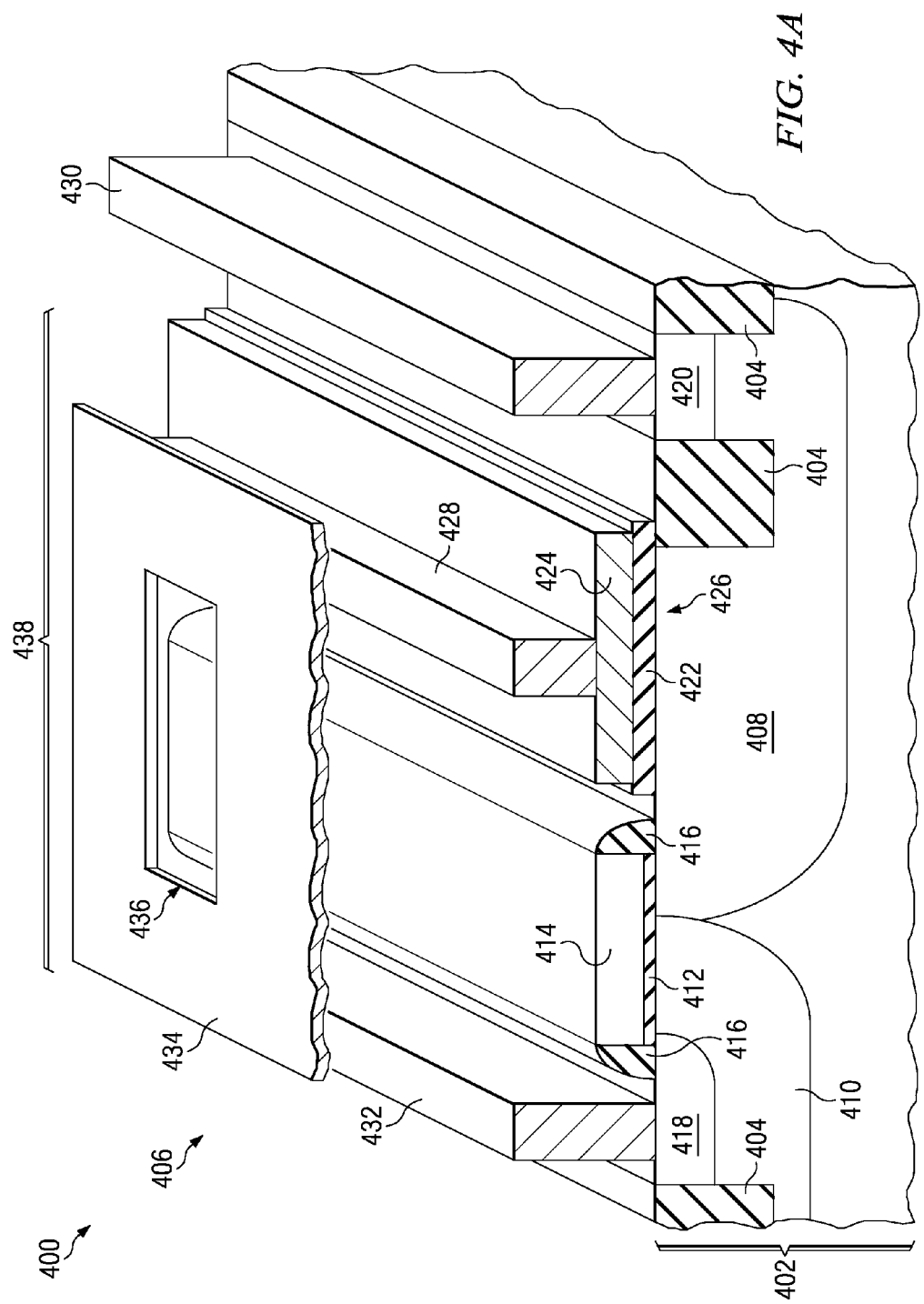
FIG. 4A and FIG. 4B are perspective cross sections of a semiconductor device containing an extended drain MOS transistor with a snubber, formed according to another embodiment, depicted in successive stages of fabrication.
Figure 4B:
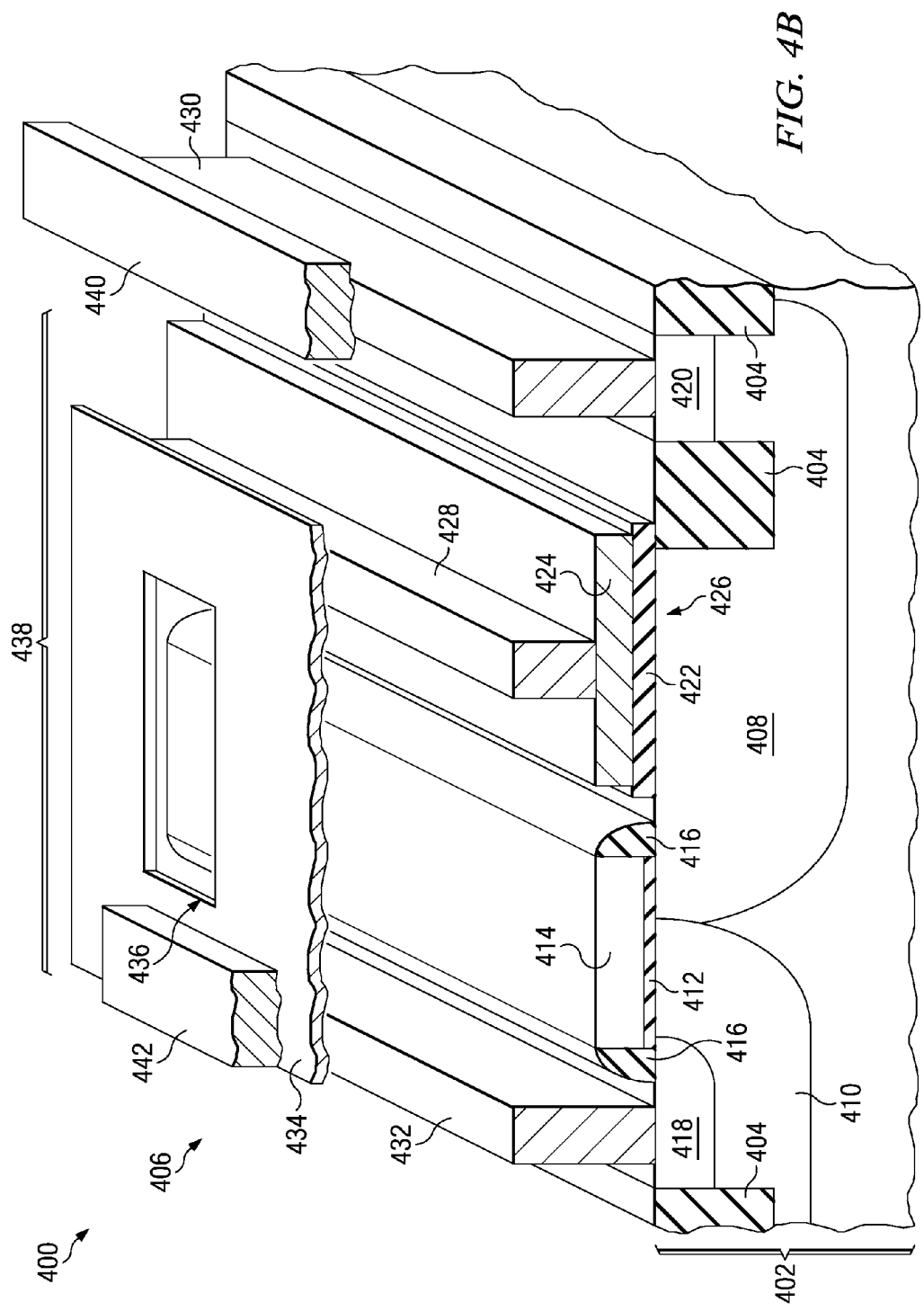

FIG. 4A and FIG. 4B are perspective cross sections of a semiconductor device containing an extended drain MOS transistor with a snubber, formed according to another embodiment, depicted in successive stages of fabrication. Referring to FIG. 4A, the semiconductor device 400 is formed in and on a semiconductor substrate 402 as described in reference to FIG. 1A. Field oxide 404 may be formed at the top surface of the substrate 402, as described in reference to FIG. 1A, for example to laterally isolate the MOS transistor 406 from other components, not shown, in the semiconductor device 400. The MOS transistor 406 has an n-type drain drift region 408, as described in reference to FIG. 1A, extending to the top surface of the substrate 402. The MOS transistor 406 further includes a p-type body region 410 in the substrate 402 abutting the drain drift region 408, as described in reference to FIG. 1A. A gate dielectric layer 412, gate 414 and optional gate sidewalls 416 of the MOS transistor 406 are formed over the substrate 402 overlapping a portion of the body region 410 and a portion of the drain drift region 408, as described in reference to FIG. 1A. The MOS transistor 406 also includes an n-type source region 418 and possibly an optional n-type drain contact region 420, as described in reference to FIG. 1A. The drain contact region 420 may be laterally isolated by an additional element of field oxide 404, as depicted in FIG. 4A.

A snubber capacitor dielectric layer 422 is formed over the drain drift region 408 adjacent to the gate 414, as described in reference to FIG. 1B. The snubber capacitor dielectric layer 422 may optionally overlap the field oxide element 404 disposed in the drain drift region 408 if present. A snubber capacitor plate 424 is formed over the snubber capacitor dielectric layer 422 so as to be electrically isolated from the drain drift region 408, as described in reference to FIG. 1B. The snubber capacitor plate 424, the snubber capacitor dielectric layer 422 and the drain drift region 408 form a snubber capacitor 426.

A PMD layer, not shown, is formed over an existing top surface of the semiconductor device 400, as described in reference to FIG. 1C. The PMD layer is not shown in FIG. 4B to more clearly illustrate the other elements of the MOS transistor 406. One or more snubber capacitor contacts 428, for example continuous snubber capacitor contacts 428 as depicted in FIG. 4A, are formed through the PMD layer so as to make electrical contact with the snubber capacitor plate 424, as described in reference to FIG. 1C. One or more transistor drain contacts 430, for example continuous transistor drain contacts 430, are formed through the PMD layer so as to make electrical contact with the drain drift region 408, through the drain contact region 420 if present. One or more transistor source contacts 432, for example continuous transistor source contacts 432, are formed through the PMD layer so as to make electrical contact with the source region 418. The transistor drain contacts 430, the transistor source contacts 432 and the snubber capacitor contacts 428 may be formed as described in reference to FIG. 1C, using contact trenches for continuous contacts.

A snubber resistor 434 is formed over the PMD layer so as to make electrical contact with the snubber capacitor contacts 428 and the transistor source contacts 432. The snubber resistor 434 is patterned so as be electrically isolated from other components, not shown, in the semiconductor device 400. A portion of the snubber resistor 434 is removed in FIG. 4A to illustrate the transistor source contacts 432. The snubber resistor 434 may include one or more layers of electrically conductive material, such as such as polysilicon, metal silicide such as tungsten silicide, titanium silicide, cobalt silicide or nickel silicide, metal such as aluminum, tungsten, titanium, tantalum, or metal alloy such as titanium tungsten, titanium nitride, tantalum nitride, nickel chromium, silicon chromium or thin film resistor material such as cermet. One or more resistor apertures 436 may be formed in the snubber resistor 434 so as to increase the electrical resistance of the snubber resistor 434. The electrical resistance of the snubber resistor 434 may be, for example, between 0.5 and 20 ohms. The snubber resistor 434 and the snubber capacitor 426 form an integrated snubber 438.

Referring to FIG. 4B, a drain interconnect 440 is formed on the PMD layer so as to make electrical contact with the transistor drain contacts 430. A source interconnect 442 is formed on the snubber resistor 434 so as to make electrical contact with the transistor source contacts 432 through the snubber resistor 434. The drain interconnect 440 and the source interconnect 442 may be formed by an aluminum metallization process or a copper damascene metallization process, as described in reference to FIG. 1C.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming a semiconductor device, comprising steps:
   providing a semiconductor substrate;
   forming an extended drain metal oxide semiconductor (MOS) transistor, by a process including steps:
      forming a drain drift region in said substrate, said drain drift region having a first conductivity type;
      forming a body region in said substrate, so that said body region abuts said drain drift region at a top surface of said substrate, said body region having a second conductivity type opposite from said first conductivity type;
      forming a gate over said substrate, so that said gate overlaps a portion of said drain drift region and a portion of said body region; and
      forming a source region in said substrate adjacent to said gate and opposite from said drain drift region, said source region having said first conductivity type; and
   forming an integrated snubber, by a process including steps:
      forming a snubber capacitor, by a process including steps:
         forming a snubber dielectric layer over said drain drift region; and
         forming a snubber capacitor plate over said snubber dielectric layer; and
      forming a snubber resistor over said gate, said snubber resistor being electrically coupled to said source region and electrically coupled to said snubber capacitor plate by:
         forming at least one snubber capacitor contact through a PMD layer on said snubber capacitor plate, so that said snubber capacitor contact is electrically connected to said snubber capacitor plate;
         forming at least one snubber source contact through said PMD layer on said source region, so that said snubber source contact is electrically connected to said source region; and
         forming a snubber resistor link over said PMD layer so that said snubber resistor link makes electrical contact to said snubber capacitor contact and to said snubber source contact.

2. The process of claim 1, in which said process of forming said snubber resistor is performed so that at least one resistor aperture is formed through said snubber resistor.

3. A process of forming a semiconductor device, comprising steps:
   providing a semiconductor substrate;
   forming an extended drain metal oxide semiconductor (MOS) transistor, by a process including step:
      forming a drain drift region in said substrate, said drain drift region having a first conductivity type;
      forming a body region in said substrate, so that said body region abuts said drain drift region at a top surface of said substrate, said body region having a second conductivity type opposite from said first conductivity type;
      forming a gate over said substrate, so that said gate overlaps a portion of said drain drift region and a portion of said body region; and
      forming a source region in said substrate adjacent to said gate and opposite from said drain drift region, said source region having said first conductivity type; and
   forming an integrated snubber, by a process including steps:
      forming a snubber capacitor, by a process including steps:
         forming a snubber dielectric layer over said drain drift region; and
         forming a snubber capacitor plate over said snubber dielectric layer; and
      forming a snubber resistor over said gate, said snubber resistor being electrically coupled to said source region and electrically coupled to said snubber capacitor plate, wherein:
   said substrate is between 5 and 100 microns thick;
   said step of forming said drain drift region is performed so that said drain drift region extends from said top surface of said substrate to proximate to a bottom surface of said substrate;
   said process of forming said MOS transistor further includes forming a drain contact region at said bottom surface of said substrate and contacting said drain drift region, so that said drain contact region has said first conductivity type;
   said step of forming said snubber capacitor dielectric layer is performed so that further said snubber capacitor dielectric layer is between 10 and 200 nanometers thick;
   said step of forming said snubber capacitor dielectric layer is performed so that further said snubber capacitor dielectric layer extends over said gate;
   said process of forming said MOS transistor further includes forming a source trench through said source region and into said body region adjacent to, but laterally separated from, said gate;
   said step of forming said snubber capacitor plate includes forming a snubber resistor/capacitor layer over said drain drift region, over said gate, over said source region and in said source trench, so that said snubber capacitor plate is a portion of a snubber resistor/capacitor layer disposed over said drain drift region; and
   said snubber resistor is a portion of said snubber resistor/capacitor layer over said gate and said source region, so that said snubber resistor/capacitor layer is electrically connected to said source region in said source trench.

4. The process of claim 3, in which said process of forming snubber resistor/capacitor layer is performed so that at least one resistor aperture is formed through said snubber resistor/capacitor layer.

5. A process of forming a semiconductor device, comprising steps:
   providing a semiconductor substrate;
   forming an extended drain metal oxide semiconductor (MOS) transistor, by a process including steps:
      forming a drain drift region in said substrate, said drain drift region having a first conductivity type;
      forming a body region in said substrate, so that said body region abuts said drain drift region at a top surface of said substrate, said body region having a second conductivity type opposite from said first conductivity type;
      forming a gate over said substrate, so that said gate overlaps a portion of said drain drift region and a portion of said body region; and
      forming a source region in said substrate adjacent to said gate and opposite from said drain drift region, said source region having said first conductivity type; and
   forming an integrated snubber, by a process including steps:
      forming a snubber capacitor, by a process including steps:
         forming a snubber dielectric layer over said drain drift region; and
         forming a snubber capacitor plate over said snubber dielectric layer; and
      forming a snubber resistor over said gate, said snubber resistor being electrically coupled to said source region and electrically coupled to said snubber capacitor plate, wherein:
   said step of forming said snubber capacitor dielectric layer is performed so that further said snubber capacitor dielectric layer is between 10 and 200 nanometers thick;
   said process of forming said snubber further includes forming at least one snubber capacitor contact through said PMD layer on said snubber capacitor plate, so that said snubber capacitor contact is electrically connected to said snubber capacitor plate;
   said process of forming said snubber further includes forming at least one snubber source contact through said PMD layer on said source region;
   said process of forming said snubber resistor is performed so that said snubber resistor is formed over a PMD layer and makes electrical contact to said snubber capacitor contact and to said snubber source contact;
   said process of forming said snubber resistor is performed so said snubber resistor includes at least one layer of material selected from the group consisting of polysilicon, tungsten silicide, titanium silicide, cobalt silicide, nickel silicide, aluminum, tungsten, titanium, tantalum, titanium tungsten, titanium nitride, tantalum nitride, nickel chromium, silicon chromium, and cermet; and
   said process of forming said semiconductor device further includes forming a source interconnect on said snubber resistor so that said source interconnect makes electrical contact with said transistor source contacts through said snubber resistor.

6. The process of claim 5, in which said process of forming said snubber resistor is performed so that at least one resistor aperture is formed through said snubber resistor.

7. The process of claim 1, in which an electrical resistance of the snubber resistor is between 0.5 and 20 ohms.

* * * * *